US010903339B2

(12) United States Patent
Lee et al.

(10) Patent No.: US 10,903,339 B2
(45) Date of Patent: Jan. 26, 2021

(54) VERTICAL TRANSPORT FET DEVICES HAVING A SACRIFICIAL DOPED LAYER

(71) Applicant: International Business Machines Corporation, Armonk, NY (US)

(72) Inventors: Choonghyun Lee, Rensselaer, NY (US); Kangguo Cheng, Schenectady, NY (US); Juntao Li, Cohoes, NY (US); Shogo Mochizuki, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/679,427

(22) Filed: Nov. 11, 2019

(65) Prior Publication Data

US 2020/0075747 A1  Mar. 5, 2020

Related U.S. Application Data

(62) Division of application No. 15/951,510, filed on Apr. 12, 2018, now Pat. No. 10,686,057.

(51) Int. Cl.
| | | |
|---|---|---|
| *H01L 29/66* | (2006.01) | |
| *H01L 29/08* | (2006.01) | |
| *H01L 21/225* | (2006.01) | |
| *H01L 21/306* | (2006.01) | |
| *H01L 21/308* | (2006.01) | |
| *H01L 21/3065* | (2006.01) | |
| *H01L 21/28* | (2006.01) | |

(52) U.S. Cl.
CPC .... *H01L 29/66666* (2013.01); *H01L 21/2257* (2013.01); *H01L 21/3065* (2013.01); *H01L 21/3081* (2013.01); *H01L 21/30604* (2013.01); *H01L 29/0847* (2013.01); *H01L 21/28123* (2013.01)

(58) Field of Classification Search
CPC .......... H01L 29/66666; H01L 21/2257; H01L 21/30604; H01L 21/3065; H01L 21/3081; H01L 29/0847; H01L 29/7827; H01L 21/28123
USPC .................................................. 257/329, 438
See application file for complete search history.

(56) References Cited

U.S. PATENT DOCUMENTS

| | | | |
|---|---|---|---|
| 7,297,600 | B2 | 11/2007 | Oh et al. |
| 7,683,428 | B2 | 3/2010 | Chidambarrao et al. |
| 8,765,546 | B1 | 7/2014 | Hung et al. |
| 9,299,835 | B1 | 3/2016 | Anderson et al. |

(Continued)

OTHER PUBLICATIONS

D. Yakimets et al., "Vertical GAAFETs for the ultimate CMOS scaling," IEEE Transactions on Electron Devices, vol. 62, No. 5, 2015, pp. 1433-1439.

(Continued)

*Primary Examiner* — Hrayr A Sayadian (74) *Attorney, Agent, or Firm* — Cantor Colburn LLP; Randall Bluestone (57) ABSTRACT

Methods of fabrication and semiconductor structures includes vertical transport field effect transistors (VTFETs) including a top source/drain extension formed with a sacrificial doped layer. The sacrificial doped layer provides the doping source to form the extension and protects the top of the fin during fabrication so as to prevent thinning, among other advantages.

11 Claims, 6 Drawing Sheets

(56) References Cited

U.S. PATENT DOCUMENTS

| | | |
|---|---|---|
| 9,431,305 B1 | 8/2016 | Anderson et al. |
| 9,530,866 B1 | 12/2016 | Zhang et al. |
| 9,640,636 B1 | 5/2017 | Bentley et al. |
| 9,698,245 B2 | 7/2017 | Cheng et al. |
| 9,716,170 B1 | 7/2017 | Cheng et al. |
| 9,735,253 B1 | 8/2017 | Bi et al. |
| 10,211,317 B1 | 2/2019 | Qi et al. |
| 2015/0372149 A1 | 12/2015 | Colinge et al. |
| 2019/0097024 A1* | 3/2019 | Li .................... H01L 21/265 |
| 2019/0319116 A1 | 10/2019 | Lee et al. |

OTHER PUBLICATIONS

List of IBM Patents or Patent Applications Treated as Related; (Appendix P), Date Filed Nov. 11, 2019; 2 pages.

\* cited by examiner

VERTICAL TRANSPORT FET DEVICES HAVING A SACRIFICIAL DOPED LAYER

DOMESTIC PRIORITY

This application is a divisional of U.S. application Ser. No. 15/951,510 entitled "VERTICAL TRANSPORT FET DEVICES HAVING A SACRIFICIAL DOPED LAYER," filed Apr. 12, 2018, incorporated herein by reference in its entirety.

BACKGROUND

The present invention relates in general to semiconductor fabrication methods and resulting structures. More specifically, the present invention relates to methods of fabricating vertical transport field effect transistors including a sacrificial doped layer for forming the top source/drain extension regions.

Field effect transistors (FETs) are commonly employed in electronic circuit applications. FETs can include a source region and a drain region spaced apart by a semiconductor channel region. A gate, potentially including a gate dielectric layer, a work function metal layer, and a metal electrode, can be formed above the channel region. By applying voltage to the gate, the conductivity of the channel region can increase and allow current to flow from the source region through the channel to the drain region.

Vertical Transport FETs (VTFET) are one of the promising alternatives to standard lateral FET structures due to benefits, among others, in terms of reduced circuit footprint. VTFETs employ semiconductor fins and side-gates that can be contacted outside the active region, resulting in increased device density and some increased performance over lateral devices. In VTFETs, the source to drain current flows in a direction that is perpendicular to a major surface of the substrate. For example, in a known VFET configuration a major substrate surface is horizontal and a vertical fin extends upward from the substrate surface. The fin forms the channel region of the transistor. A source region and a drain region are situated in electrical contact with the top and bottom ends of the channel region, while a gate is disposed on one or more of the fin sidewalls.

SUMMARY

Embodiments of the present invention are generally directed to integrated circuits including one or more vertical field effect transistors and methods of fabrication. A non-limiting example of a method for forming a vertical field effect transistor includes depositing a hardmask on a substrate including an epitaxially grown etch stop layer and an epitaxially grown sacrificial doped layer. The hardmask overlays the epitaxially grown sacrificial doped layer. Patterning the substrate forms one or more fin channels, wherein the patterned hardmask, patterned etch stop layer, and the patterned sacrificial doped layer overlay each of the one or more fin channels. Bottom source/drain regions are formed adjacent the one or more fin channels on the substrate. A bottom spacer layer is formed on the bottom source/drain regions. A doped top portion and a doped bottom portion are formed in each of the one or more fin channels. A high k metal gate structure is formed about each of the one or more fin channels. A liner layer is formed on the high k metal gate structure. An interlayer dielectric is deposited on the substrate. A portion of the interlayer dielectric and the high k metal gate structure is selectively removed stopping at the hardmask. The hardmask, the doped sacrificial layer, and the etch stop layer overlaying each of the one or more fin channels are selectively removed. A portion of the high k metal gate structure is selectively removed to form a recess between the liner layer and the top doped portion of the one or more fin channels. The recess is filled with a top spacer material and a source/drain material is epitaxially grown on the doped top portion of the one or more fin channels to form the vertical field effect transistor.

A non-limiting example of a method of forming one or more vertical field effect transistors in an integrated circuit according to aspects of the invention includes forming one or more vertical fin channels in a silicon substrate including thereon an epitaxially grown undoped silicon-germanium layer and a doped epitaxially grown silicon layer on the undoped silicon germanium layer. A bottom source/drain is epitaxially grown adjacent each of the one or more vertical fin channels. Dopant ions from the bottom source/drain region are diffused into each lower portion of the one or more vertical fin channels to form a doped bottom portion and dopant ions from the doped epitaxially grown silicon layer are diffused into each top portion of the one or more vertical fin channels to form a doped top portion. A gate structure is formed about each of the one or more vertical fin channels and an interlayer dielectric is deposited. The interlayer dielectric is patterned and the doped epitaxially grown silicon layer and the epitaxially grown undoped silicon-germanium layer is removed from the one or more vertical fin channels. A top source/drain is epitaxially grown on the doped top portion of each of the one or more vertical fin channels to define the one or more vertical field effect transistors.

A non-limiting example of a structure for forming a vertical field effect transistor according to aspects of the invention includes a vertical fin channel having a lower diffusion doped portion and an upper diffusion doped portion provided on a substrate. Epitaxially grown bottom source/drain region are adjacent each side of the vertical fin channel. A gate structure surrounds the at least one vertical fin channel and an epitaxially grown top source/drain region is on the upper doped portion of the vertical fin channel.

DETAILED DESCRIPTION

The present invention is generally directed to methods and vertical transport field effect transistor (VTFET) structures for forming top source/drain extension regions for the VTFET structure, which reduce the external resistance between the channel and the top source/drain. Currently, the process flow for forming VTFET structures has strict constraints on thermal budget for downstream processing steps because the high k metal gate module is formed early in the process. The top source/drain junction formation is one of the biggest challenges as it currently requires a high temperature anneal. Early top source/drain junction epitaxial schemes are currently employed to overcome the thermal budget issues, but it suffers from top fin loss. The highly doped top/source drain extension regions becomes skinny by downstream processes such as the reactive ion etch processes and the deposition/etch/annealing steps. In the present invention, methods and structure are provided that overcome the prior art issues by forming the top source/drain extension regions with a sacrificial doped layer, which is later removed. As will be described in greater detail, the sacrificial doped layer provides the desired doping source to form the extension and also provides a protective layer to protect the fin top during processing.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, an article or apparatus that comprises a list of elements is not necessarily limited to only those elements but can include other elements not expressly listed or inherent to such article or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

It should also be understood that material compounds will be described in terms of listed elements, e.g., SiN, or SiGe. These compounds include different proportions of the elements within the compound, e.g., SiGe includes $Si_xGe_{1-x}$ where x is less than or equal to 1, and the like. In addition, other elements can be included in the compound and still function in accordance with the present principles. The compounds with additional elements will be referred to herein as alloys.

It should be noted that not all masking, patterning, and lithography processes are shown, because a person of ordinary skill in the art would recognize where masking and patterning processes are utilized to form the identified layers and openings, and to perform the identified selective etching processes, as described herein.

Figure 1:
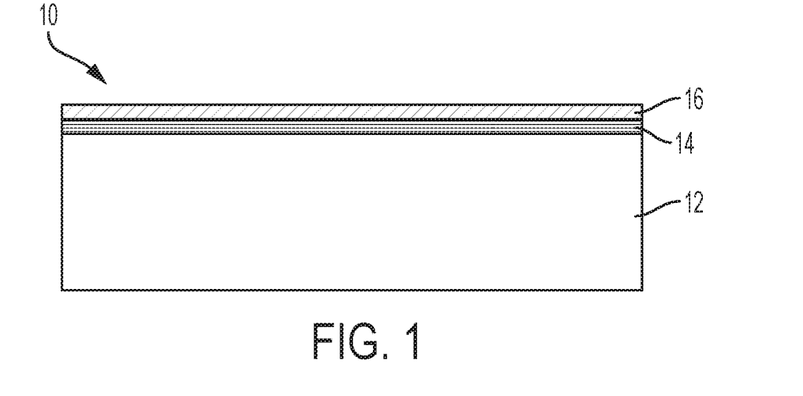
FIG. 1 depicts a cross sectional view of a semiconductor structure including a sacrificial doped layer and an etch stop layer in accordance with one or more embodiments.

Turning now to FIG. 1, there is shown a cross section of an exemplary incoming semiconductor structure 10 suitable for completing fabrication of semiconductor structure including one or more VTFETs in accordance with one or more embodiments. The semiconductor structure 10 includes a base substrate 12. The base substrate 12 can include, for example, silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The base substrate 12 can also include an organic semiconductor or a layered semiconductor such as, for example, Si/SiGe, a silicon-on-insulator or a SiGe-on-insulator. A portion or entire semiconductor substrate 12 can be amorphous, polycrystalline, or monocrystalline. In addition to the aforementioned types of semiconductor substrates, the base substrate employed in the present invention can also include a hybrid oriented (HOT) base substrate in which the HOT substrate has surface regions of different crystallographic orientation. The base substrate 12 can be doped, undoped or contain doped regions and undoped regions therein. The base substrate can contain regions with strain and regions without strain therein, or contain regions of tensile strain and compressive strain.

An undoped silicon germanium (SiGe) layer 14 is formed on the base substrate 12, which can function as an etch stop layer in the method of manufacture. The thickness of the undoped SiGe layer can be in a range of about 2 nanometers to about 5 nanometers (nm).

A sacrificial doped layer 16 is formed on the undoped SiGe layer 14. For nFET devices, Si:P can be used as the doping layer whereas for pFET devices, SiGe:B can be used as the doping layer. The thickness of the sacrificial doped layer 16 is generally in a range of about 5 nm to about 10 nm.

The undoped SiGe layer 14 and the sacrificial doped layer 16 can be formed by an epitaxial growth process that deposits a crystalline semiconductor material onto selected areas of the base substrate 12. The epitaxial growth process can include epitaxial materials grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain generally can range from about $1 \times 10^{19}$ cm$^{-3}$ to about $2 \times 10^{21}$ cm$^{-3}$, or, in other embodiments, from about $2 \times 10^{20}$ cm$^{-3}$ to about $1 \times 10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 2:
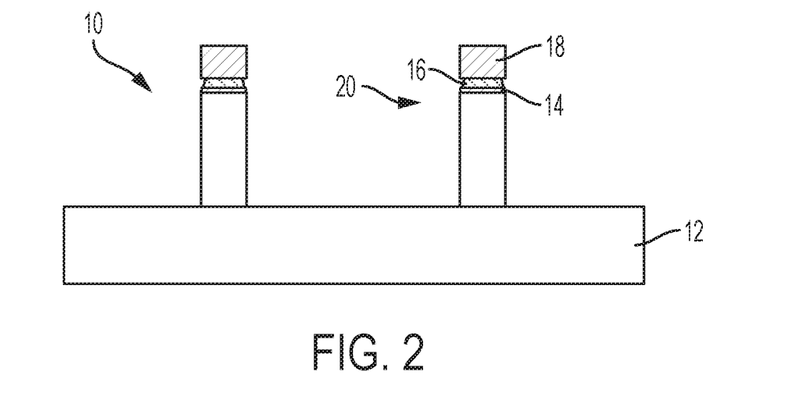
FIG. 2 depicts a cross sectional view of the semiconductor structure of FIG. 1 subsequent to fin formation in accordance with one or more embodiments.

In FIG. 2, fin channels 20 are formed in the base substrate 12, two of which are shown. The number and size of fin channels to be formed can be based on the intended current handling capacity of the electronic device structure. Formation of the fin channels generally includes deposition and lithographic patterning of a hardmask layer 18 followed by an anisotropic etching process. Because there is no stop layer on the base substrate 12, the etch process can be time-based. A suitable anisotropic etching process includes reactive ion etching. As shown, because the sacrificial doped layer 16 etches at a faster rate than the base substrate 12, undercutting in the sacrificial doped layer is observed below the hardmask 18. In contrast, prior processes to form the VTFET would result in fin channel loss without the protection of the sacrificial doped layer.

The height of the fin channels 20 in the z direction can be in the range of about 30 nm to about 400 nm, or in the range of about 50 nm to about 300 nm, or in the range of about 75 nm to about 200 nm. In various embodiments, the width of the fin channels 20 in the x direction can be in the range of about 5 nm to about 30 nm, or about 10 nm to about 20 nm. In various embodiments, the aspect ratio of the fin channels 20 can be in the range of about 3 to about 40, or in the range of about 5 to about 20, or in the range of about 7 to about 10. In various embodiments, the fin channels 20 can have a length in the y direction in the range of about 10 nm to about 2000 nm, or in the range of about 20 nm to about 1000 nm, or in the range of about 25 nm to about 500 nm, where the length in the y direction is greater than the width in the x direction.

The hardmask 18 can include, for example, silicon oxide, silicon nitride (SiN), or any suitable combination of those. The hardmask 18 can be deposited using a deposition process, including, but not limited to, PVD, CVD, PECVD, or any combination thereof.

Figure 3:
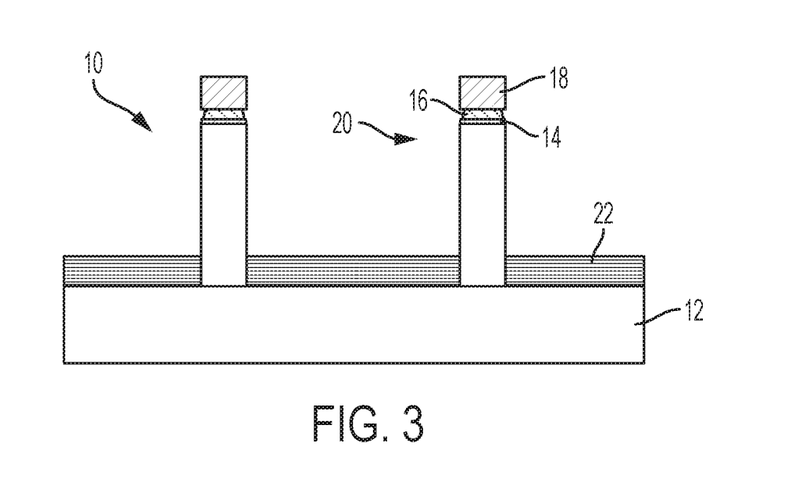
FIG. 3 depicts a cross sectional view of the semiconductor structure of FIG. 2 subsequent to bottom source/drain formation in accordance with one or more embodiments.

In FIG. 3, bottom source/drain regions 22 (e.g., drain regions as well as the source regions for the completed VTFETs) can be formed by an epitaxial growth process that deposits a crystalline semiconductor material onto selected areas of the substrate 12 to form the bottom source/drain region 22. By way of example, the bottom source/drain regions for pFETs can be formed of SiGe:B, and bottom source/drain regions for nFETs can be formed of Si:P.

Figure 4:
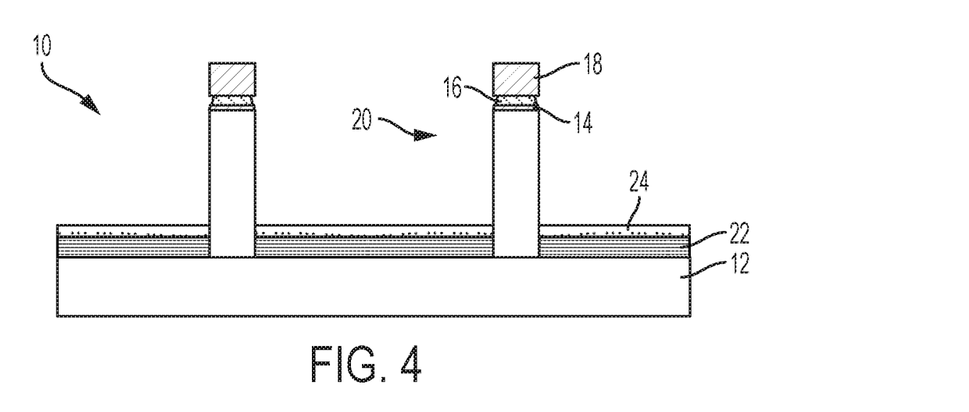
FIG. 4 depicts a cross sectional view of the semiconductor structure of FIG. 3 subsequent to bottom spacer formation in accordance with one or more embodiments.

In FIG. 4, a bottom spacer layer 24 can be deposited by any non-conformal deposition methods that provides a faster deposition rate on the planar surface and slower deposition rate on the sidewall surface including but not limited to plasma vapor deposition (PVD), high density plasma (HDP) deposition or the like. As shown, the bottom spacer layer is disposed between the vertically oriented fin structures. The PVD or HDP process is highly directional and deposits the spacer onto the bottom of the trenches but less on fin sidewall. After directional deposition of bottom spacer, an etch-back process is performed to remove the any residue of spacer materials from the fin sidewall. In PVD, a pure source material is gasified via evaporation, the application of high power electricity, laser ablation, or the like. The gasified material will then condense on the substrate material to create the desired layer. The bottom spacer 24 can be a low k dielectric material. The term "low k dielectric" generally refers to an insulating material having a dielectric constant less than silicon dioxide, i.e., less than 3.9. Exemplary low k dielectric materials include, but are not limited to, dielectric nitrides (e.g., silicon nitride, SiBCN), dielectric oxynitrides (e.g., SiOCN), or any combination thereof or the like.

Figure 5:
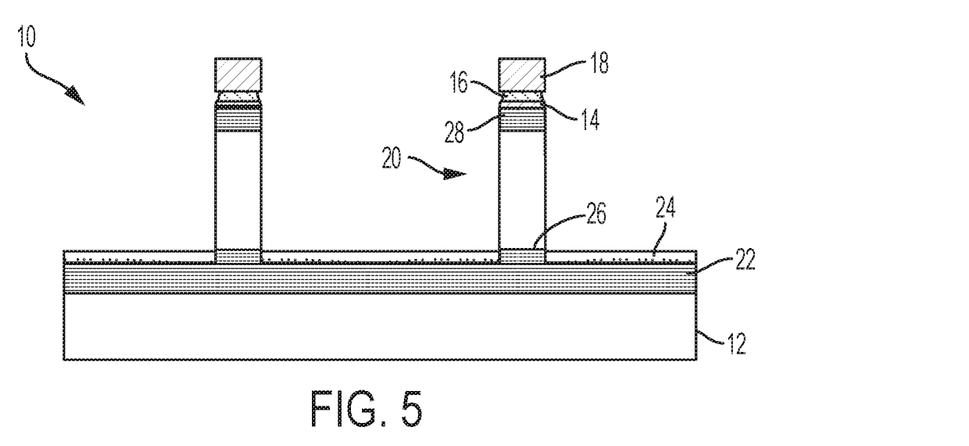
FIG. 5 depicts a cross sectional view of the semiconductor structure of FIG. 4 subsequent to junction formation at the top and bottom of the fin by high temperature doping in accordance with one or more embodiments.

FIG. 5 depicts the semiconductor structure 10 subsequent to junction formation at the bottom and top regions 26, 28, respectively, for each fin channel 20. In one or more embodiments, junction formation generally includes a high temperature spike anneal process to drive in the selected dopant from the sacrificial doped layer 16 for the top portion 28 and from the bottom source/drain 22 for the bottom portion 26 of each one of the fin channels 20. The high temperature doping generally includes a heating the substrate at a temperature of about 950° C. to about 1000° C. in a nitrogen ambient atmosphere for a period of time effective to drive in the desired amount of dopant into the respective top portion 28 or bottom portion 26. Advantageously, the sacrificial doped layer 16 provides doping to form the extension as noted above but also serves as a protection layer to prevent thinning at the top of the fin channel during processing.

Figure 6:
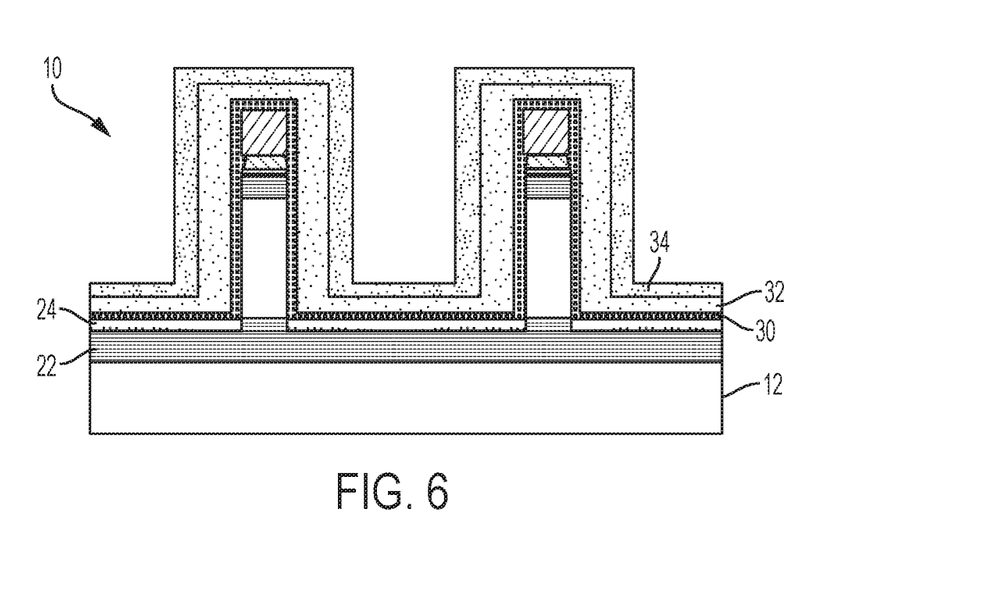
FIG. 6 depicts a cross sectional view of the semiconductor structure of FIG. 5 subsequent to high k/metal gate formation in accordance with one or more embodiments.

FIG. 6 depicts the semiconductor structure 10 subsequent to high k/metal gate formation. A high k dielectric material 30 is conformally deposited onto the structure followed by deposition of a metal gate material 32. An encapsulation layer 34, i.e., liner layer, is then provided on the metal gate material 32.

The gate dielectric material(s) can be a dielectric material having a dielectric constant greater than 3.9, 7.0, or 10.0. Non-limiting examples of suitable materials for the dielectric materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The gate dielectric materials can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material can vary depending on the deposition process as well as the composition and number of high-k dielectric materials used. The dielectric material layer can have a thickness in a range from about 0.5 to about 20 nm.

The work function metal(s) can be disposed over the gate dielectric material. The type of work function metal(s) depends on the type of transistor and can differ between the nFET and pFET devices. Non-limiting examples of suitable work function metals include p-type work function metal materials and n-type work function metal materials. P-type work function materials include compositions such as titanium nitride, tantalum nitride, ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

The insulator layer 34 can be the same material as the hard mask material 18. In one or more embodiments, the hardmask layer 18 and the insulator layer 34 are silicon nitride.

Figure 7:
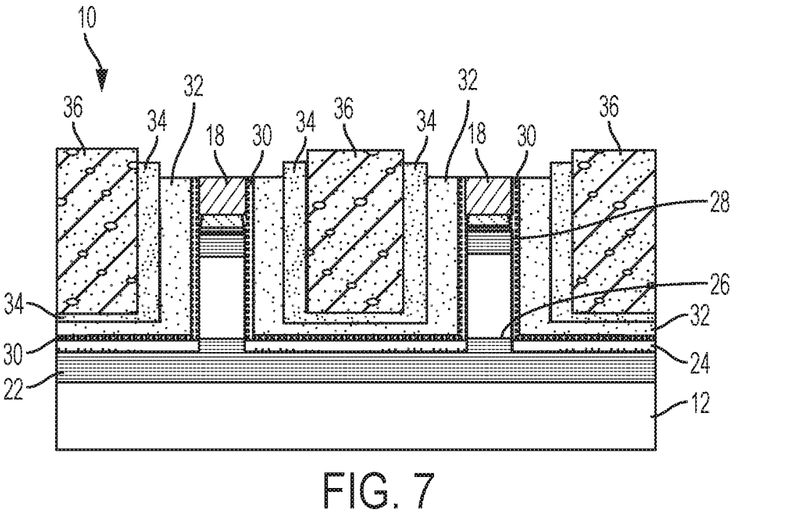
FIG. 7 depicts a cross sectional view of the semiconductor structure of FIG. 6 subsequent to hard mask exposure in accordance with one or more embodiments.

In FIG. 7, an interlayer dielectric 36 such as silicon dioxide is then deposited onto the structure 10 and chemical mechanical planarization (CMP) process is performed to expose the hardmask 18. The insulator layer 36 can be selectively removed by a reactive ion etch process and the metal gate can be removed by a wet etch, which can vary depending on the metal gate material.

Figure 8:
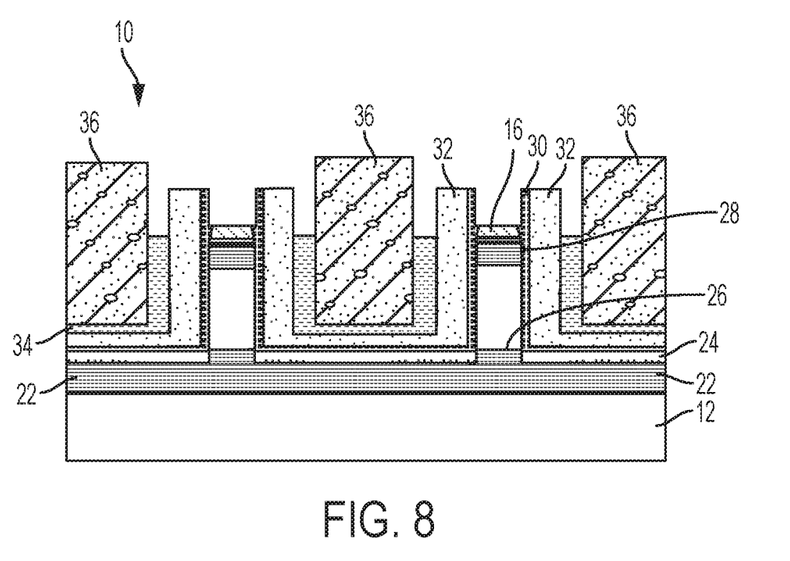
FIG. 8 depicts a cross sectional view of the semiconductor structure of FIG. 7 subsequent to hard mask removal in accordance with one or more embodiments.

In FIG. 8, the hardmask 18 is selectively pulled to expose the sacrificial doped layer 16. The hardmask 18 can be selectively removed by a dry or wet etch process. For example, in the case of a silicon nitride hardmask, the silicon nitride can be selectively removed relative to the interlayer dielectric 36, the metal gate 32 and the high k layer 30 by exposing the substrate to hot phosphoric acid. A portion of the liner layer 34 will also be selectively removed to provide the structure 10 as shown.

Figure 9:
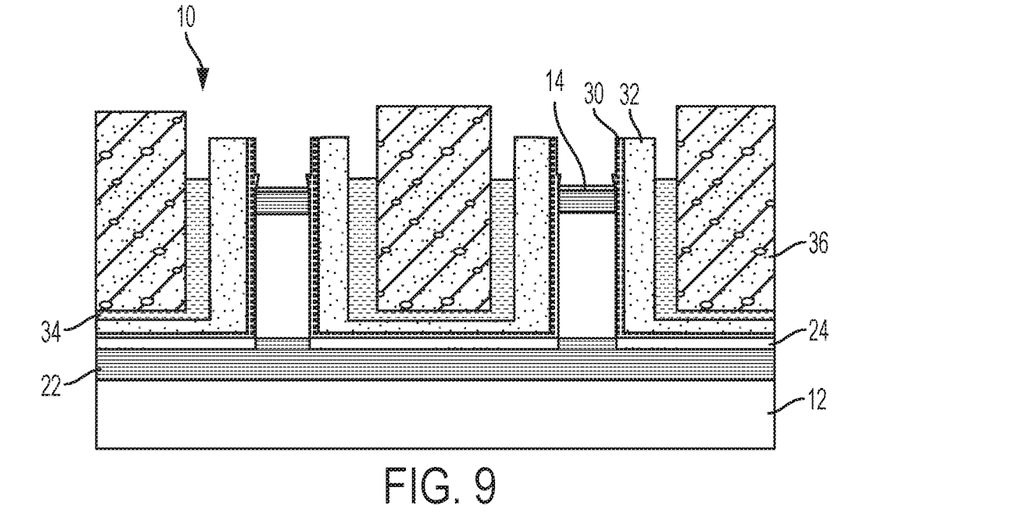
FIG. 9 depicts a cross sectional view of the semiconductor structure of FIG. 8 subsequent to doped sacrificial layer in accordance with one or more embodiments.

In FIG. 9, the sacrificial doped layer 16 is removed by, for example, a wet etch process. By way of example, in the case of a doped silicon material as the sacrificial doped layer 16, the doped silicon material can be removed by an ammonia wet etch process stopping on the etch stop layer 14, e.g., undoped SiGe layer.

Figure 10:
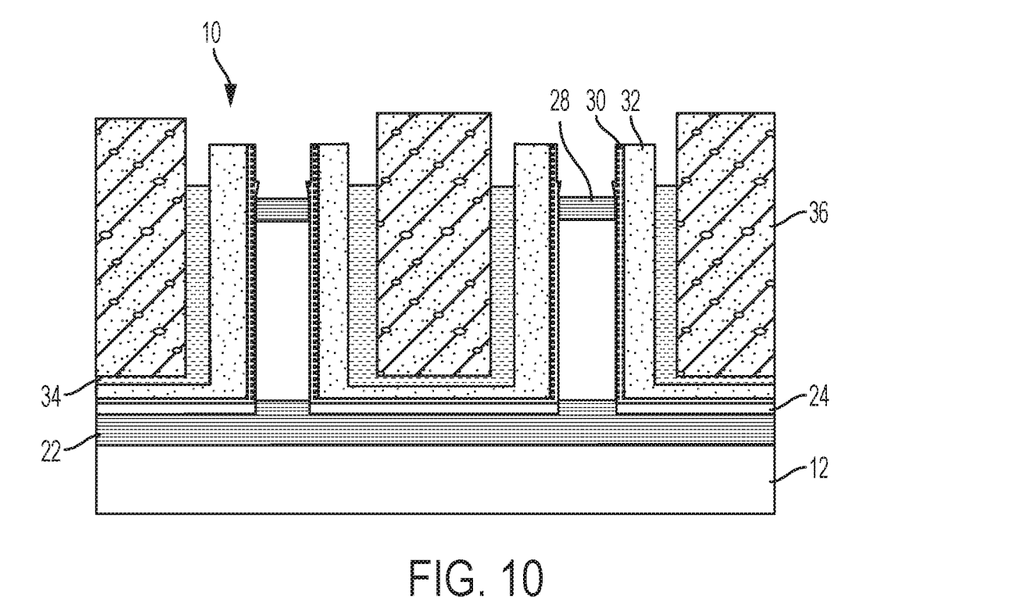
FIG. 10 depicts a cross sectional view of the semiconductor structure of FIG. 9 subsequent to etch stop layer removal in accordance with one or more embodiments.

In FIG. 10, subsequent to removal of the sacrificial doped layer 16, the etch stop layer 14 is then removed to expose the doped region 28 at the top of the fin channel 20. By way of example, the etch stop layer 14 can be undoped SiGe and can be removed using an ammonia/hydrogen peroxide wet etch process. The top of the fin can then be used as a reference point to remove the exposed high k dielectric 30 and metal gate 32 when forming the top spacer.

Figure 11:
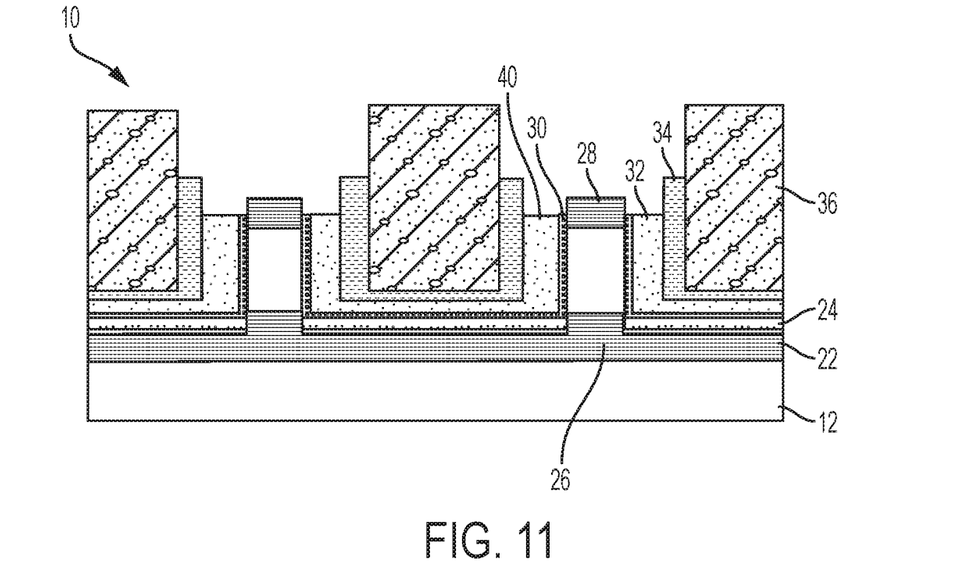
FIG. 11 depicts a cross sectional view of the semiconductor structure of FIG. 10 subsequent to high k/metal gate recess in accordance with one or more embodiments.

In FIG. 11, selective removal of the exposed high k dielectric 30 and the metal gate 32 creates a recess 40 between the doped region 28 of the fin channel 20 and the liner layer 34. By way of example, an etch back process using SC-1 wet etch process can be used to remove the metal gate 32 and expose the doped region 28 at the top of the fin channel 20 followed by an HCl wet etch process to remove the high k dielectric 30, thereby forming the recess 40 as shown between the top doped region 28 of the fin channel 20 and the liner layer 34.

Figure 12:
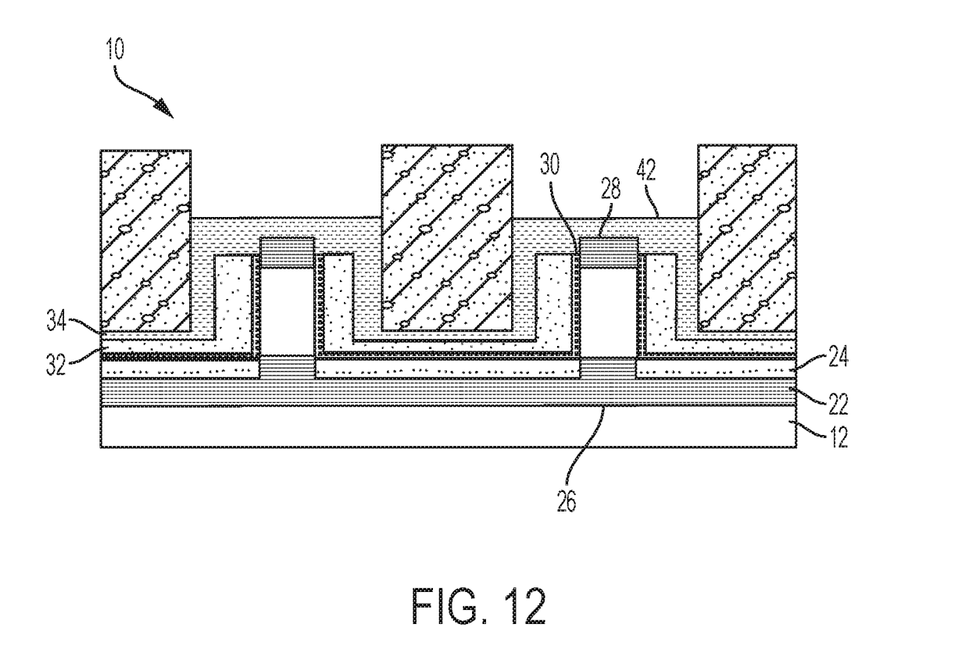
FIG. 12 depicts a cross sectional view of the semiconductor structure of FIG. 11 subsequent to top spacer formation in accordance with one or more embodiments.

In FIG. 12, the top spacer 42 is then deposited into the recess 40 between the liner layer 34 and the top doped region 28 of the fin channel 20. The top spacer 42 can be formed of the same material as the liner layer 34, e.g., silicon nitride. An etch back process can be used to expose the top doped region 28 of the fin channel 20 as shown.

Figure 13:
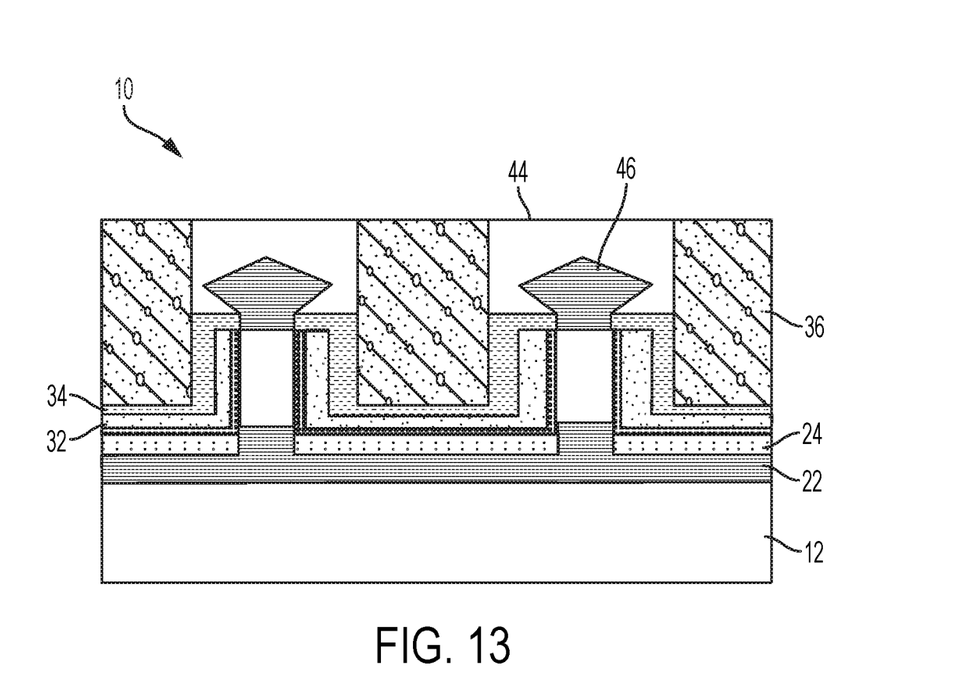
FIG. 13 depicts a cross sectional view of the semiconductor structure of FIG. 12 subsequent to epitaxial formation of top source/drain in accordance with one or more embodiments.

In FIG. 13, the top source/drains 46 are formed by an epitaxial growth process on the doped region 28 of the fin channels 20. Advantageously, a high temperature spike anneal process is not needed because the junctions have already been formed. A metal interconnect can then be deposited to electrically contact the VFET.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:
1. A method of forming one or more vertical field effect transistors comprising:
 forming one or more vertical fin channels in a silicon substrate comprising thereon an epitaxially grown undoped silicon-germanium layer and a doped epitaxially grown silicon layer on the undoped silicon germanium layer;

epitaxially growing a bottom source/drain adjacent each of the one or more vertical fin channels;

diffusing dopant ions from the bottom source/drain region into each lower portion of the one or more vertical fin channels to form a doped bottom portion and diffusing dopant ions from the doped epitaxially grown silicon layer into each top portion of the one or more vertical fin channels to form a doped top portion;

forming a gate structure about each of the one or more vertical fin channels;

depositing an interlayer dielectric;

patterning the interlayer dielectric and removing the doped epitaxially grown silicon layer and the epitaxially grown undoped silicon-germanium layer from the one or more vertical fin channels; and epitaxially growing a top source/drain on the doped top portion of each of the one or more vertical fin channels to define the one or more vertical field effect transistors.

2. The method of claim 1, wherein diffusing the dopant ions to form the top and bottom doped portions in each of the one or more vertical fin channels comprises a high temperature annealing process at a temperature effective to drive in the dopant ions from the sacrificial dopant layer to the top portion and drive in dopants from the bottom source/drain region to the bottom portion.

3. The method of claim 1, wherein the vertical field effect transistor comprises a pFET.

4. The method of claim 1, wherein the vertical field effect transistor comprises an nFET.

5. The method of claim 1, wherein selectively removing the doped epitaxially grown silicon layer and the epitaxially grown undoped silicon-germanium layer from the one or more vertical fin channels comprises applying a wet etch chemistry to sequentially remove the doped epitaxially grown silicon layer and the epitaxially grown undoped silicon-germanium layer from the one or more vertical fin channels.

6. The method of claim 5, wherein the epitaxially grown undoped silicon-germanium layer from the one or more vertical fin channels functions as an etch stop layer.

7. The method of claim 1, wherein epitaxially growing the top source/drain is free of an annealing step.

8. The method of claim 1, wherein forming the gate structure comprises conformally depositing a high k dielectric material followed by deposition of a metal gate material and deposition of a n encapsulation layer on the metal gate material.

9. The method of claim 8, wherein the high k dielectric material has a dielectric constant greater than 3.9.

10. The method of claim 8, wherein the high k dielectric comprises hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, or lead zinc niobate.

11. The method of claim 8, wherein the high k dielectric further comprises lanthanum or aluminum dopants.

* * * * *